(12) United States Patent
Sherstyuk et al.

(10) Patent No.: US 12,385,979 B2
(45) Date of Patent: Aug. 12, 2025

(54) METHODS AND SYSTEMS FOR BATTERY FORMATION

(71) Applicant: Gbatteries Energy Canada Inc., Ottawa (CA)

(72) Inventors: Mykola Sherstyuk, Ottawa (CA); Oleksandr Puzakov, Carp (CA); Oleksandr Tkachenko, Ottawa (CA)

(73) Assignee: Gbatteries Energy Canada Inc., Ottawa (CA)

( * ) Notice: Subject to any disclaimer, the term of this patent is extended or adjusted under 35 U.S.C. 154(b) by 604 days.

(21) Appl. No.: 17/771,251

(22) PCT Filed: Oct. 20, 2020

(86) PCT No.: PCT/CA2020/051407
§ 371 (c)(1),
(2) Date: Apr. 22, 2022

(87) PCT Pub. No.: WO2021/077213
PCT Pub. Date: Apr. 29, 2021

(65) Prior Publication Data
US 2022/0390522 A1 Dec. 8, 2022

Related U.S. Application Data

(60) Provisional application No. 62/925,007, filed on Oct. 23, 2019.

(51) Int. Cl.
*H01M 4/04* (2006.01)
*G01B 7/06* (2006.01)
(Continued)

(52) U.S. Cl.
CPC ........... *G01R 31/3865* (2019.01); *G01B 7/06* (2013.01); *G01R 31/388* (2019.01);
(Continued)

(58) Field of Classification Search
CPC .. H01M 4/0447; H01M 4/0445; H01M 4/044; H01M 10/446; H01M 10/441;
(Continued)

(56) References Cited

U.S. PATENT DOCUMENTS

| 5,307,000 A | 4/1994 | Podrazhansky et al. |
| 8,765,306 B2 | 7/2014 | Amiruddin et al. |

(Continued)

OTHER PUBLICATIONS

International Search Report for related application PCT/CA2020/051407 issued Dec. 29, 2020.
(Continued)

*Primary Examiner* — Raymond Alejandro

(57) ABSTRACT

Disclosed are methods, systems, and devices for battery formation. A first set of pulses, having a first frequency, and that carry a net zero charge, are applied to a battery. After the first set of pulses are applied to the battery, a second set of pulses that carry a net positive charge are applied to the battery. The second set of pulses are either applied after expiry of a particular time period following the application of the first set of pulses, or based on some battery measurements. After the second set of pulses are applied to the battery, a battery parameter is measured, and based on the measured battery parameter, a third set of pulses, having a second frequency, and that also carry a net zero charge, are applied to the battery.

15 Claims, 8 Drawing Sheets

(51) Int. Cl.
    *G01R 31/385*      (2019.01)
    *G01R 31/388*      (2019.01)
    *H01M 10/44*      (2006.01)
    *H01M 10/48*      (2006.01)

(52) U.S. Cl.
    CPC ....... *H01M 4/0447* (2013.01); *H01M 10/446* (2013.01); *H01M 10/48* (2013.01)

(58) Field of Classification Search
    CPC .. H01M 10/448; H01M 10/48; H01M 10/482; G01R 31/3865; G01R 31/388; G01B 7/06
    See application file for complete search history.

(56) References Cited

U.S. PATENT DOCUMENTS

| | | |
|---|---|---|
| 10,153,651 B2 | 12/2018 | Taylor et al. |
| 10,491,025 B1 * | 11/2019 | Ebrahimzadeh .. H01M 10/0525 |
| 2007/0096689 A1 * | 5/2007 | Wozniak ............. G01R 31/392 |
| | | 320/112 |
| 2020/0259338 A1 * | 8/2020 | Taylor ................ H01M 10/049 |

OTHER PUBLICATIONS

Seong Jin An et al: "The state of understanding of the lithium-ion-battery graphite solid electrolyte interphase (SEI) and its relationship to formation cycling", Carbon, vol. 105, Aug. 2016, pp. 52-76 Sections 9-10 on pp. 62-64 and 67.

B.K. Purushothaman and U. Landau: "Rapid Charging of Lithium-Ion Batteries Using Pulsed Currents: A Theoretical Analysis", Journal of the Electrochemical Society, vol. 153, No. 3, A533, Published Jan. 26, 2006 Abstract, A536, "Simulation and Discussion of Pulse Charging", paragraph 2 and Figure 8 (B).

Dubarry et al: "Perspective on Commercial Li-ion Battery Testing, Best Practices for Simple and Effective Protocols", Electronics 2020, 9(1), 152; https://doi.org/10.3390/electronics9010152 A/P Revised: Jan. 6, 2020/Accepted: Jan. 8 Section 2.2.

* cited by examiner

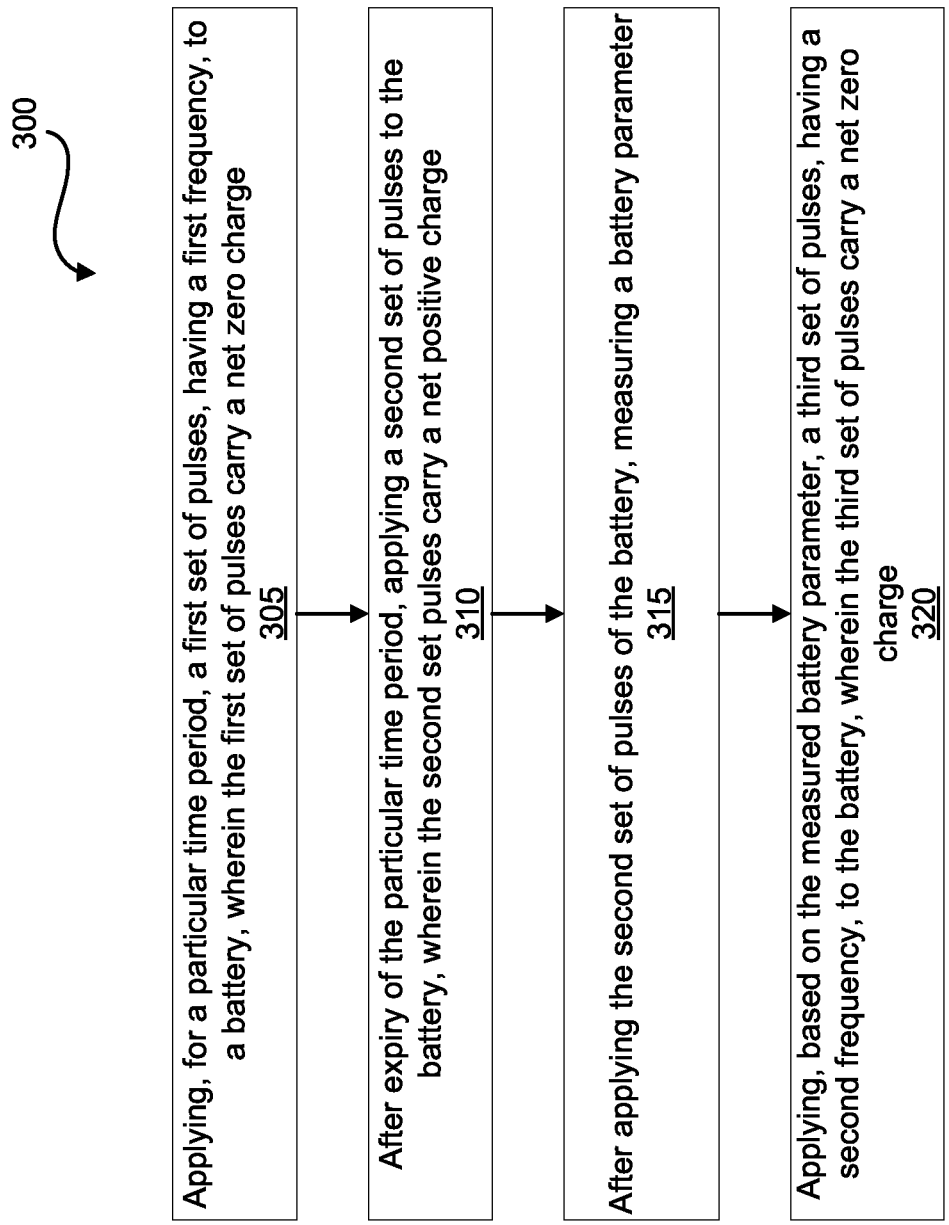

METHODS AND SYSTEMS FOR BATTERY FORMATION

CROSS REFERENCE TO RELATED APPLICATIONS

This application claims priority to U.S. Provisional Patent Application No. 62/925,007, filed on Oct. 23, 2019, the content of which is incorporated herein by reference in its entirety for all purposes.

TECHNICAL FIELD

The present specification relates to battery formation, and in particular to battery formation using pulse charging methods and systems.

BACKGROUND

Batteries (e.g., Lithium-ion batteries, lithium metal batteries, silicon anode batteries etc.) include one or more positive electrodes, one or more negative electrodes, and an electrolyte provided within a case or housing. Separators made from a porous polymer or other suitable material may also be provided intermediate or between the positive and negative electrodes to prevent direct contact between adjacent electrodes. The positive electrode includes a current collector having an active material provided thereon, and the negative electrode includes a current collector having an active material provided thereon. The active materials for the positive and negative electrodes may be provided on one or both sides of the current collectors. The electrodes may be provided as relatively flat or planar plates or may be wrapped or wound in a spiral or other configuration (e.g., an oval configuration). The electrode may also be provided in a folded configuration.

During charging and discharging of the battery, ions move between the positive electrode and the negative electrode. For example, in a Li-ion battery, when the battery is discharging, lithium ions flow from the negative electrode to the positive electrode. In contrast, when the battery is charging, lithium ions flow from the positive electrode to the negative electrode.

SUMMARY

According to an implementation of the present specification, there is provided a method of battery formation, the method comprising: applying a first set of pulses, having a first frequency, to a battery, wherein the first set of pulses carry a net zero charge; after applying the first set of pulses to the battery, measuring a first battery parameter; applying, based on the measured first battery parameter, a second set of pulses to the battery, wherein the second set of pulses carry a net positive charge; after applying the second set of pulses to the battery, measuring a second battery parameter; and applying, based on the measured second battery parameter, a third set of pulses, having a second frequency, to the battery, wherein the third set of pulses carry a net zero charge.

The applying the first set of pulses to the battery may comprise applying a sequence of alternating positive pulses and negative pulses to the battery.

The applying the third set of pulses to the battery may comprise applying a sequence of alternating positive pulses and negative pulses to the battery.

The measuring the first battery parameter may comprise determining a thickness of solid electrolyte interphase (SEI) layer of the battery.

The measuring the second battery parameter may comprise determining a value of one of: a state of charge (SoC) or a voltage of the battery.

The method may further comprise determining a value of the second frequency based on the measured second battery parameter.

The applying the first set of pulses to the battery may comprise applying sinusoidal pulses to the battery.

The applying the third set of pulses to the battery may comprise applying sinusoidal pulses to the battery.

According to another implementation of the present specification, there is provided an apparatus to form a battery, the apparatus comprising: at least one processor; and a non-transitory computer-readable storage medium configured to store instructions, wherein the instructions, in response to execution, by the at least one processor, cause the at least one processor to perform or control performance of operations that comprise: apply a first set of pulses, having a first frequency, to the battery, wherein the first set of pulses carry a net zero charge; after application of the first set of pulses to the battery, determine a value of a first battery parameter; apply, based on the value of the first battery parameter, a second set of pulses to the battery, wherein the second set of pulses carry a net positive charge; after application of the second set of pulses to the battery, determine a value of a second battery parameter; and apply, based on the value of second battery parameter, a third set of pulses, having a second frequency, to the battery, wherein the third set of pulses carry a net zero charge.

The first set of pulses may comprise a sequence of alternating positive pulses and negative pulses.

The third set of pulses may comprise a sequence of alternating positive pulses and negative pulses.

The first battery parameter may comprise a thickness of solid electrolyte interphase (SEI) layer of the battery, and the second battery parameter may comprise one of: a state of charge (SoC) or a voltage of the battery.

At least one of the first set of pulses and the third set of pulses may comprise sinusoidal pulses.

According to another implementation of the present specification, there is provided a method of battery formation, the method comprising: applying, for a particular time period, a first set of pulses, having a first frequency, to a battery, wherein the first set of pulses carry a net zero charge; after expiry of the particular time period, applying a second set of pulses to the battery, wherein the second set of pulses carry a net positive charge; after applying the second set of pulses to the battery, measuring a battery parameter; and applying, based on the measured battery parameter, a third set of pulses, having a second frequency, to the battery, wherein the third set of pulses carry a net zero charge.

The applying the first set of pulses to the battery may comprise applying a sequence of alternating positive pulses and negative pulses to the battery.

The applying the third set of pulses to the battery may comprise applying a sequence of alternating positive pulses and negative pulses to the battery.

The measuring the battery parameter may comprise determining a value of one of: a state of charge (SoC) or a voltage of the battery.

The applying the first set of pulses to the battery may comprise applying sinusoidal pulses to the battery.

The applying the third set of pulses to the battery may comprise applying sinusoidal pulses to the battery.

The applying the second set of pulses to the battery may comprise applying a set of pulses, having the first frequency or the second frequency, to the battery.

According to another implementation of the present specification, there is provided an apparatus to form a battery, the apparatus comprising: apply, for a particular time period, a first set of pulses, having a first frequency, to the battery, wherein the first set of pulses carry a net zero charge; after expiry of the particular time period, apply a second set of pulses to the battery, wherein the second set of pulses carry a net positive charge; after application of the second set of pulses to the battery, determine a value of a battery parameter; and apply, based on the value of the battery parameter, a third set of pulses, having a second frequency, to the battery, wherein the third set of pulses carry a net zero charge.

The first set of pulses may comprise a sequence of alternating positive pulses and negative pulses.

The third set of pulses may comprise a sequence of alternating positive pulses and negative pulses.

The battery parameter may comprise one of: a state of charge (SoC) or a voltage of the battery.

At least one of the first set of pulses and the third set of pulses may comprise sinusoidal pulses.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions. In the accompanying drawings:

FIG. 3 shows a flowchart of another example method of battery formation, in accordance with some implementations of the present specification.

DETAILED DESCRIPTION OF THE DISCLOSURE

Figure 1:
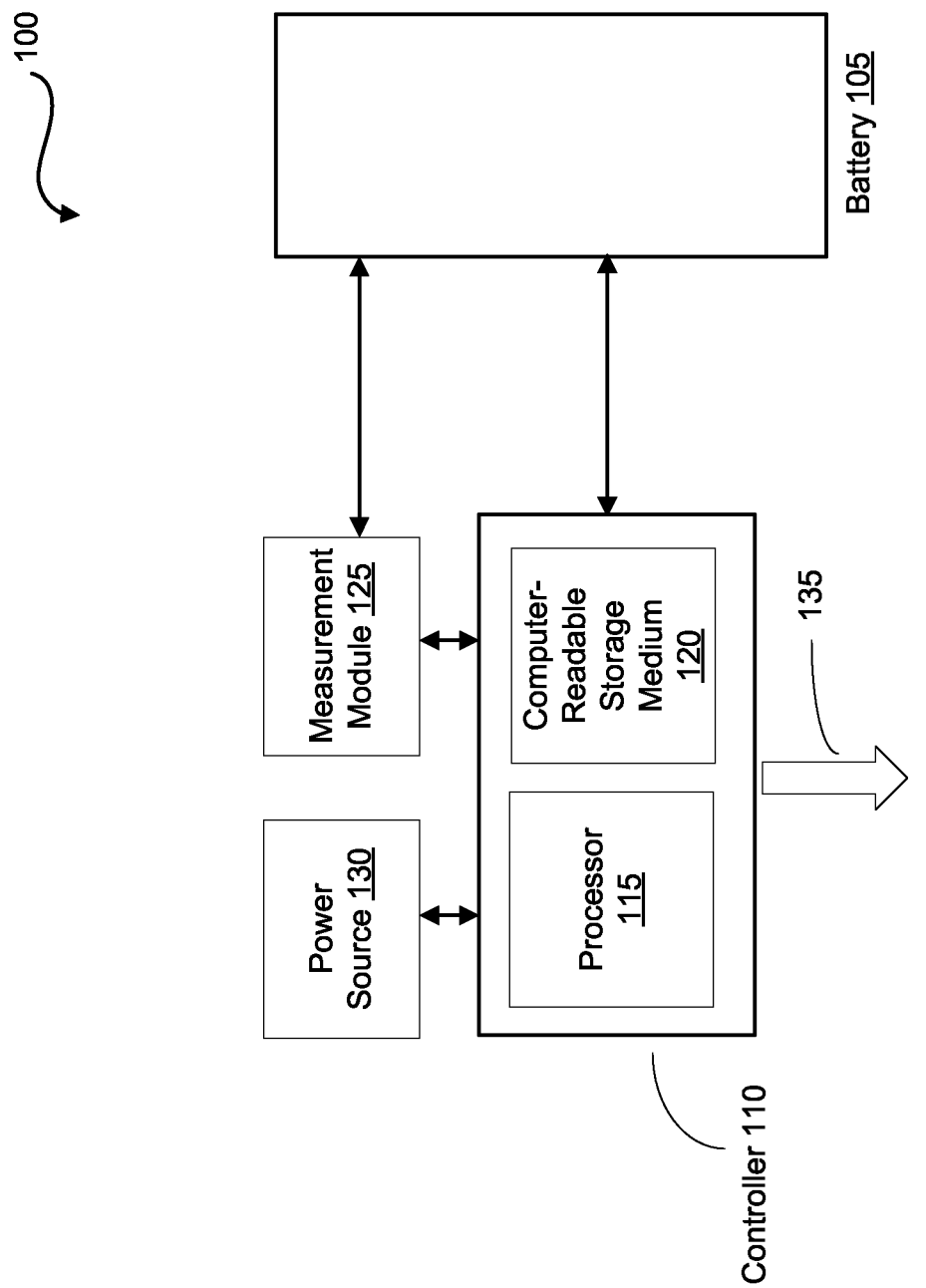
FIG. 1 shows a block diagram of an example battery formation system, in accordance with some implementations of the present specification.

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage, or mode of operation.

The terminology used herein is provided to describe particular embodiments only and is not intended to limit any embodiments disclosed herein. As used herein, the singular forms "a," "an," and "the" are intended to include the plural forms as well, unless the context clearly indicates otherwise. It will be further understood that the terms "comprises," "comprise," "includes," and/or "including," when used herein, specify the presence of stated features, integers, steps, operations, elements, and/or components, but do not preclude the presence or addition of one or more other features, integers, steps, operations, elements, components, and/or groups thereof.

Unless defined otherwise, all technical and scientific terms used herein have the same meaning as commonly understood by one of ordinary skill in the art to which this disclosure belongs.

Generally, battery (e.g., Li-ion) manufacturing is a complicated procedure, which includes electrode production, stack construction, and cell assembly. Once the cell assembly is complete, the cell must be put through precisely controlled charge discharge cycles to activate the working materials, transforming them into their useable form. Instead of the normal constant current-constant voltage charging curve, the charging process begins with a low voltage which builds up gradually. This is called the formation process. In other words, battery formation is the process of performing the initial charge/discharge operations on a battery. During the battery formation, an electrochemical solid electrolyte interphase (SEI) will be formed at the electrode, mainly on an anode. An analogous layer known as the cathode electrolyte interphase layer forms at the cathode at high potentials. The formation of the SEI layer is sensitive to many different factors and has major impacts on battery performance during its life time. Battery formation typically takes many days depending on the battery chemistry. For example, using a 0.1 C (where C is the cell capacity) current during formation is very typical, taking up to 20 hours for a full charge and discharge cycle.

In some cases, the formation process for batteries (e.g., lithium ion batteries) typically takes several days or more as it is thought to be necessary for providing the stable SEI on the anode (at low potentials vs. Li/Li+) for preventing irreversible consumption of electrolyte and ions (e.g., Li ions). However, several days, or even up to a week, of these processes result in lower battery production rates. Also, the requirement of a large size of charging-discharging equipment and space typically used for current battery formation processes makes the battery formation process expensive (making up 20% to 30% of the total battery cost).

Additionally, with current battery formation techniques, SEI layer formed may not be uniform in thickness, porosity and/or other characteristics, which may lead to degraded battery performance. Also, energy losses in the hardware equipment employed for battery formation are significant.

Hence, there is a need for an improved process and hardware for battery formation.

The methods and systems disclosed herein for battery formation not only obviate the above drawbacks of currently employed battery formation techniques, but also have several advantages, such as, but not limited to, enhanced uniformity of a SEI layer, reduced time of battery formation, advanced SEI layer structure, which allows for improved battery performance in terms of fast charging and capacity fading.

FIG. 1 shows an example battery formation system 100 in accordance with a non-limiting implementation of the present specification. The battery formation system 100 comprises a battery 105, which may be a yet to be formed battery. The battery 105 comprises a single battery cell.

In some implementations, the battery 105 may be a lithium ion battery. In some implementations, the battery 105 may comprise, but not limited to, silicon anode battery cells(s), lithium metal battery cell(s), sodium ion battery cell(s), or the like. The systems, methods, and devices described herein may not be limited by the number or type of battery cells in the battery 105.

The battery formation system 100 further comprises a controller 110, which is operatively coupled to the battery 105. The controller 110 may control formation of the battery 105 in accordance with the methods described herein. For example, the controller may perform or control performance of operations of an example method 200 illustrated in FIG. 2, and/or an example method 300 illustrated in FIG. 3. The controller 110 may comprise a processor 115 to control formation of the battery 105 in accordance with the present specification. The controller 110 may further comprise a non-transitory computer-readable storage medium 120 which may store instructions, which are executable by the processor 115 for the controller 110 to perform or control performance of operations in relation to formation of the battery 105 in accordance with the methods described herein. The computer-readable storage medium 120 may be a computer memory or storage device which may be any suitable memory apparatus, such as, but not limited to ROM, PROM, EEPROM, RAM, flash memory, disk drive and the like. In some implementations, the processor 115 may execute the instructions stored in the computer-readable storage medium 120 which may cause the controller 110 to perform or control performance of an example method 200 illustrated in FIG. 2, and/or an example method 300 illustrated in FIG. 3.

In some implementations, for battery formation, the controller 110 may facilitate charging of the battery 105 by employing any of the charging protocols, including but not limited to, CC-CV charging protocol, a pulse charging protocol, a constant current protocol, a constant voltage protocol, or the like.

In some implementations, the controller 110 may be a microcontroller and may comprise a central processing unit (e.g., processor 115) to process instructions and data, on-board memory to store instructions and data, a digital to analog converter for analog data conversion obtained from other modules of the battery formation system 100, and drive circuitry for control of the various modules of the battery formation system 100.

In some implementations, the controller 110 (e.g., processor 115) may also monitor (e.g., measure using a measurement module) various parameters of the battery 105, and use the monitored parameters to manage operation of the battery 105. The various parameters monitored by the controller 110 may comprise, but not limited to, voltage, current, state of charge (SoC), temperature, state of health, and the like. Additionally, the controller 110 (e.g., processor 115) may calculate various values, which include but not limited to charge current limit (CCL), discharge current limit (DCL), energy delivered since last charge or discharge cycle, internal impedance, and charge delivered or stored (coulomb counter) for the battery 105 as well as individual battery cells when the battery 105 is a battery pack. In some implementations, the controller 110 may also determine a thickness of SEI layer of the battery 105 to adapt or control the battery formation process accordingly.

In some implementations, the controller 110 may implement a battery model that may be used to determine how the formation charging parameters may be adapted in accordance with the methods disclosed herein. Such a battery model may be built during the battery characterization. For example, in the characterization phase, a statistically varied production samples of the battery 105 may be slowly charged for formation, and optimized battery formation charging parameters (e.g., optimized for speed of charge, for cycle life of battery, and/or for calendar life of battery) may be determined from such slow formation charges. Such optimized charging parameters may be registered, and the battery model may be built. In an example, battery parameters such as capacity, and CCV of the battery (e.g., during discharging pulse) may be stored against discharging pulse parameters and/or charging pulses parameters, and make-up the battery model. Such battery model may be used by the controller 110 to adapt battery formation charging as disclosed herein.

In some implementations, the controller 110 may include an artificial intelligence-based logic (e.g., implemented by the processor 115), and the controller 110 may be a self-learning controller. Such a controller may build the battery model during charging and/or discharging of the battery, and may learn how to adapt the battery formation based on the data in the battery model and/or based on actual battery measurements performed during charging and/or discharging of the battery.

The controller 110 may be configured to generate control pulses that are provided to a plurality of switches (FIGS. 5 and 6) to control operation of the switches to produce the charging pulses and/or discharging pulses to charge the battery 105. In accordance with the present disclosure, in an example, the controller 110 may modulate the frequency (e.g., pulse period) of the control pulses. For example, the controller 110 may control the duration of the ON period and the OFF period of each control pulse that leads to modulation of the pulse period of the charging pulses and/or discharging pulses. In some embodiments, for example, the switches may be field effect transistor (FET) devices. The switches may be controlled (ON, OFF) to apply charging and/or discharging pulses to the battery 105.

The battery formation system 100 further comprises a measurement module 125 (e.g., sensors and associated circuitry) to measure various parameters of the battery 105 and/or battery cells of the battery 105. In some implementations, the measurement module 125 is operatively coupled to the battery 105 and the controller 110, and may be controlled by the controller 110 to perform various measurement related operations to form the battery 105 in accordance with the methods disclosed herein. The measurement module 125 may comprise various sensors, such as, but not limited to, ammeter, voltmeter, temperature sensor, coulomb counter, and the like. In some examples, the measurement module 125 may also comprise some mechanical sensors such as, but not limited, to piezo-electric sensors (for determining battery swelling which is indicative of imbalance in the battery pack or mechanical stress inside the battery).

Various parameters that may be measured by the measurement module 125 and as controlled by the controller 110 may comprise voltage (e.g., open circuit voltage (OCV), closed-circuit voltage (CCV), current (e.g., charging current or discharging current), temperature, state-of-charge (SoC), and the like), for the battery 105 as well as individual battery cells of the battery 105. In some implementations, the measurement module 125 may comprise circuitry to determine thickness of SEI layer of the battery 105.

In some implementations, the measurement module 125 may be implemented as a component of the controller 110. In such implementations, the controller 110 may be configured to measure and determine values of various parameters (such as of current, voltage, temperature, SoC, SEI layer thickness or the like) for the battery 105.

The battery formation system 100 may further comprise a power source 130, which may be, for example, a dedicated adaptor, such as AC-to-DC wall adapter. In most cases, such adaptors are designed with the specific battery charging needs in mind, and thus the source capabilities of the power source 130 allow for proper capacity-based charging current of batteries, such as battery 105. In some implementations, the power source 130, may be, for example, a non-dedicated adaptor, such as a universal charger not necessarily designed with any specific battery capacity in mind. As another example, the power source 130 may be a communication or computer bus voltage signal, intended to provide power to a number of devices connected in parallel or serially to the bus. One non-limiting example of this type of voltage source is a Universal Serial Bus (USB) connection, which provides a voltage bus (VBUS) signal from which a constrained amount of current may be drawn. Another example of the power source 130 may be a USB-C connector, which is a 24-pin USB connector system, which is distinguished by its two-fold rotational-symmetrical connector. The controller 110 may interface with the power source 130 to obtain power to facilitate formation of the battery 105 in accordance with the present disclosure.

In some implementations, the power source 130 may comprise or be coupled to circuitry to apply charging and/or discharging pulses to the battery 105 for battery formation in accordance with the methods disclosed herein. In an example implementation, the power source 130 may be a power source 510 or a power source 610 (FIGS. 5 and 6) that provides power to apply charging and/or discharging pulses to the battery 105 for battery formation in accordance with the methods disclosed herein.

The battery formation system 100 may further comprise a communication interface 135 for the controller 110 to communicate with the hardware within the battery 105, and/or with the circuitry to be controlled by the controller 110 for the formation of the battery 105. For example, the communication interface 135 may enable communication of the controller 110 with an example systems 500, 600 (FIGS. 5 and 6) to control various elements or components of those systems for the battery formation in accordance with the methods disclosed herein.

It is contemplated that a person of ordinary skill in the art may vary implementation of the battery formation system 100 and such variations are within the scope of the present disclosure. For example, the controller 110 may be implemented as a component of the power source 130. In some implementations, the controller 110 may be housed in a housing of the power source 130. Similarly, in other implementations, the controller 110 may be implemented as a component of the battery 105. In some implementations, the controller 110 may be housed in a housing of the battery 105. In some implementations, the controller 110 may be implemented as a separate module (e.g., add-on module) which may interface with the power source 130, and/or example systems 500, 600 to perform formation of the battery 105 in accordance with the methods disclosed herein.

Figure 2:
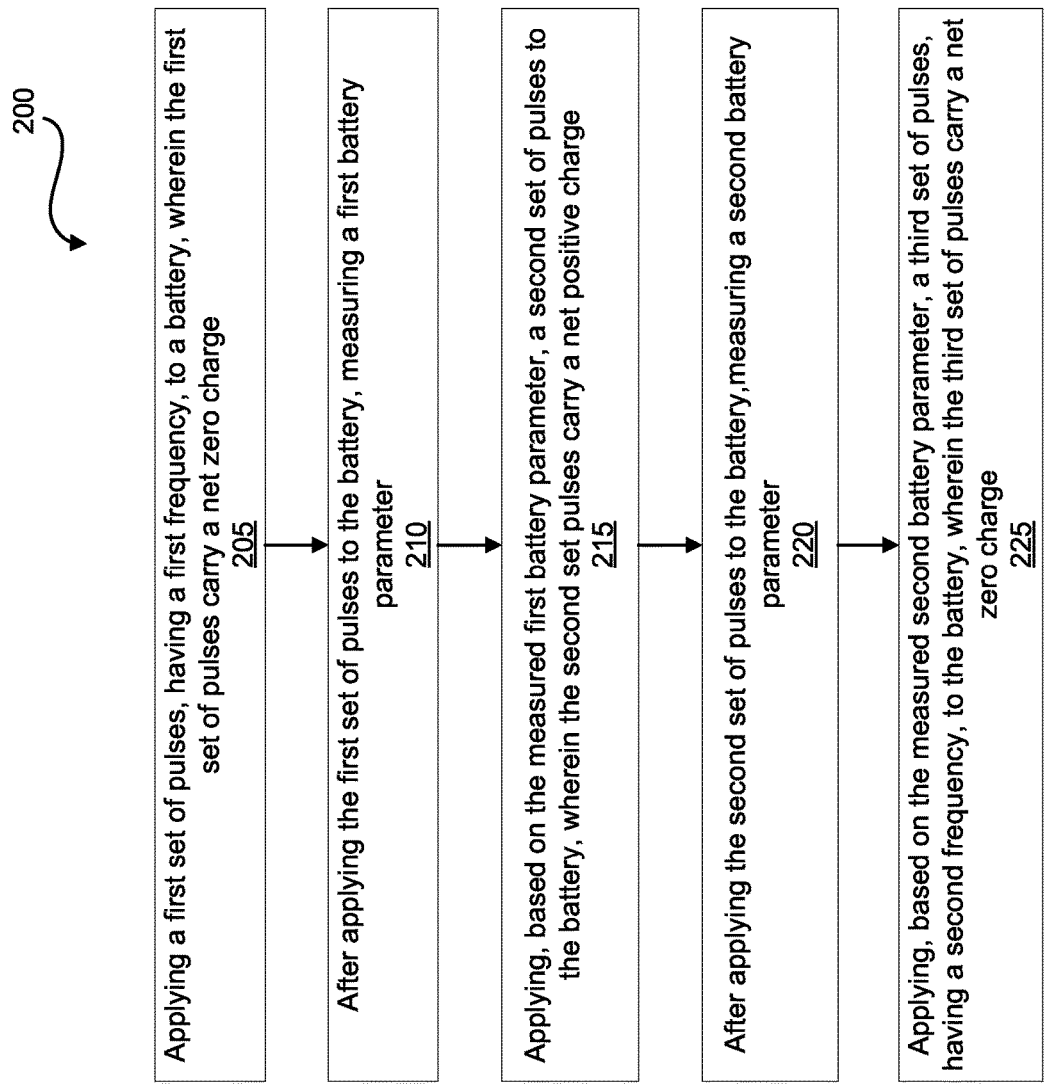
FIG. 2 shows a flowchart of an example method of battery formation, in accordance with some implementations of the present specification.

FIG. 2 is a flowchart illustrating an example method for battery formation in accordance with a non-limiting implementation of the present specification. The method 200 illustrated in FIG. 2 may be performed by the controller 110 for formation of the battery 105. The controller 110 may employ example hardware illustrated in FIGS. 5 and 6 to perform the method 200.

The method 200 begins at 205, where a first set of pulses is applied to the battery. The first set of pulses are applied at a particular frequency (e.g., first frequency) to the battery, and the first set of pulses carry a net zero charge. In an example, the first frequency may be 1 kHz. In some implementations, the first set of pulses may carry high current (e.g., up to 1 C) or very high current (e.g., up to 10 C). In an example implementation, a sequence of alternating positive and negative pulses may be applied, as the first set of pulses to the battery 105, in that an amount of charge applied by the positive pulses to the battery 105 is equal to the amount of charge removed from the battery 105 by the negative pulses. Therefore, the sequence of alternating positive and negative pulses carries a net zero charge. In other words, the sequence of alternating positive pulses and negative pulses applied to the battery 105 may comprise each positive pulse followed by a negative pulse and vice versa. Since the amount of charge and discharge carried by the positive and negative pulses is same, the net effect on a state of charge (SoC) of the battery 105 is zero.

In some implementations, the first set of pulses may comprise a sequence of symmetrical alternating positive and negative pulses. In an example implementation, the controller 110 may apply the sequence of symmetrical alternating positive and negative pulses to the battery 105. In some implementations, the symmetrical positive and negative pulses comprise pulses having same characteristics (e.g., same amplitude, frequency, ON/OFF time, shape, duty cycle, or the like) except for the polarity of a pulse. In other words, after each positive pulse (e.g., charge pulse), a symmetrical negative pulse (e.g., discharge pulse)—that has same pulse characteristic(s) as the preceding positive pulse is applied to the battery, and vice versa. Such sequence of symmetrical alternating positive and negative pulses may also carry a net zero charge. In other words, the application of such a sequence may result in no change in SoC of the battery. Such sequence of symmetrical alternating positive and negative pulses is illustrated in FIGS. 3A and 3C.

In some implementations, the first set of pulses may comprise positive and negative pulses, which may not be alternating and/or symmetrical. However, the net charge carried by such positive and negative pulses (e.g., total charge by positive pulses minus total discharge by negative pulses) may be zero. In an example implementation, the controller 110 may apply such sequence of positive and negative pulses (which may not be alternating and/or symmetrical) to the battery 105. Such positive and negative pulses may have different pulse parameters from each other (e.g., amplitude, frequency, ON/OFF time, shape, duty cycle, or the like) but may carry the same amount of charge/discharge. In other words, the application of a sequence of such set of pulses have a zero-charge effect on the battery (e.g., net charge change in the battery is zero).

In some implementations, the first set of pulses may comprise a train of positive pulses followed by a train of negative pulses, or the vice versa. The train of negative pulses may discharge the battery by a particular amount which is equal to the amount of charge put into the battery by the train of positive pulses. Thus, the first set of pulses carry a net zero charge.

At 210, after the first set of pulses are applied to the battery, a first battery parameter may be measured. For example, the controller 110, after applying the first set of pulses to the battery 105, measures a first battery parameter. In some implementations, the first battery parameter may comprise a thickness of SEI layer of the battery. The controller 110 may use the measurements obtained by the measurement module 125 to determine the thickness of the SEI layer of the battery 105.

A person of ordinary skill in the art may appreciate that the thickness of the SEI layer may be determined by any of the generally used techniques. In some implementations, Electrochemical Impedance Spectroscopy (EIS) may be performed (e.g., by the controller 110) to determine the thickness of the SEI layer of the battery (e.g., battery 105). For example, the thickness of the SEI layer of the battery may be determined by performing some battery measurements (e.g., battery impedance), and performing Fast Fourier Transform (FFT) on the information extracted from the battery measurements (e.g., battery impedance). Fast Fourier transform (FFT) techniques allows to detect battery parameters in form of SEI layer thickness.

In another example, the following equation may be used to monitor the thickness of the SEI layer. The impedance results of the battery (e.g., obtained from the EIS measurements) can be fitted into an equivalent electrical circuit to determine the SEI resistance. This film resistance ($R_{SEI}$) of the SEI layer can be described according to this equation:

$$R_{SEI} = \delta_{SEI}/\kappa$$

In this equation, $\delta_{SEI}$ is the thickness of SEI layer, $\kappa$ is the conductivity of the SEI film, which is equal to $3.9 \times 10^7$ for batteries with a graphite anode. The value of $\kappa$ may be different for silicon based or lithium metal based anode. Having determined the film resistance using EIS results, the above equation can be solved for the thickness of the SEI layer.

At 215, a second set of pulses that carry the net positive charge are applied to the battery based on the measured first battery parameter. In some implementations, the second set of pulses may comprise positive and negative pulses. The amount of charge applied to the battery by the positive pulses of the second set of pulses is greater than the amount of charge withdrawn from the battery by the negative pulses of the second set of pulses, therefore resulting in overall charge of the second positive pulses to be net positive charge. In some implementations, the second set of pulses may comprise only positive pulses (no negative pulses). In some implementations, the second set of pulses to be applied to the battery may be chosen to have a particular amount of net positive charge such that the second set of pulses results in particular amount of increase in voltage (e.g., 0.1 V, 0.25V, or 0.5 V increase) or SoC (2%, 5%, or 10% SoC increase) in the battery.

In some implementations, the second set of pulses may have the first frequency (similar to the first set of pulses) or the second frequency (similar to the third set of pulses). In other words, the second set of pulses may be applied to the battery 105 at the frequency which is same as a frequency of pulses preceding the second set of pulses, or at the frequency which is same as a frequency of pulses that are to be applied subsequent to the application of the second set of pulses. In some implementation, the amplitude difference between the positive and negative pulses of the second set of pulses may be low (e.g., C/20) for varying SoC of the battery at a slower rate. In an example implementation, the controller 110 may modulate the amplitude difference between the positive and negative pulses of the second set of pulses to vary the rate at which the SoC of the battery 105 changes.

In an example implementation, the controller 110 may apply the second set of pulses to the battery 105 based on determining that the thickness of the SEI layer of the battery is at a desired value. In other words, the application of the first set of pulses of the battery 105 may form the SEI layer inside the battery 105. When the SEI layer in the battery 105 is formed to have the particular thickness level, the controller 110 may decide to apply the positive charge to the battery (e.g., by applying the second set of pulses having net the positive charge) for the voltage (e.g., open circuit voltage (OCV)) or SoC of the battery to attain the particular value where then the next set of pulses (e.g., third set of pulses) are applied for the SEI layer to be formed at that voltage or that SoC level of the battery.

At 220, after the second set of pulses are applied to the battery, a second battery parameter may be measured. In some implementations, the second battery parameter may be one of: a voltage or SoC of the battery. For example, the controller 110 after applying the second set of the pulses to the battery 105 may determine a value of one of voltage or SoC of the battery 105. As described previously, the controller 110 applies the second set of pulses having net the positive charge to the battery 105 for the voltage (e.g., open circuit voltage (OCV)) or SoC of the battery to reach the particular value where then the next set of pulses (e.g., third set of pulses) are to be applied for the SEI layer to be formed at that voltage or SoC level of the battery. Therefore, after applying the second set of pulses to the battery 105, the controller may determine a value of voltage or SoC of the battery to ensure that the voltage or SoC of the battery is at the particular value before deciding to apply the next set of pulses for the formation of the SEI layer at that particular voltage or the SoC level of the battery.

At 225, the third set of pulses that carry a net zero charge are applied to the battery based on the measured second battery parameter. The third set of pulses are applied at a particular frequency (e.g., second frequency) to the battery, which is different from the first frequency at which the first set of values are applied. In an example, the second frequency may be 1 Hz. The frequency of the third set of pulses may be determined based on the measured second battery parameter. In other words, the frequency of the third set of pulses to be applied to the battery may be determined based on a current value of the voltage (e.g., OCV) or SoC of the battery.

The third set of pulses carry a net zero charge. In some implementations, the third set of pulses may carry high current (e.g., up to 1 C) or very high current (e.g., up to 10 C). In an example implementation, a sequence of alternating positive and negative pulses (forming the third set of pulses) may be applied to the battery 105, in that an amount of charge applied by the positive pulses to the battery 105 is equal to the amount of charge removed from the battery 105 by the negative pulses. Therefore, the sequence of alternating positive and negative pulses carries a net zero charge. In other words, the sequence of alternating positive pulses and negative pulses applied to the battery 105 may comprise each positive pulse followed by a negative pulse and vice versa. Since the amount of charge and discharge provided by the positive and negative pulses is same, the net effect on a state of charge (SoC) of the battery 105 is zero.

In some implementations, the third set of pulses may comprise a sequence of symmetrical alternating positive and negative pulses (similar to the first set of pulses but different in frequency of pulses). In an example implementation, the controller 110 may apply the sequence of symmetrical alternating positive and negative pulses to the battery 105. In some implementations, the symmetrical positive and negative pulses comprise pulses having same characteristics (e.g., same amplitude, frequency, ON/OFF time, shape, duty cycle, or the like) except for the polarity of a pulse. In other words, after each positive pulse (e.g., charge pulse), a symmetrical negative pulse (e.g., discharge pulse)—that has same pulse characteristic(s) as the preceding positive pulse is applied to the battery, and vice versa. Such sequence of symmetrical alternating positive and negative pulses may also carry a net zero charge. In other the application of such a sequence may result in no change in SoC of the battery. Such sequence of symmetrical alternating positive and negative pulses is illustrated in FIGS. 3A and 3C.

In some implementations, the third set of pulses may comprise positive and negative pulses, which may not be alternating and/or symmetrical. However, the net charge carried by such positive and negative pulses (e.g., total charge by positive pulses minus total discharge by negative pulses) may be zero. In an example implementation, the controller 110 may apply such sequence of positive and negative pulses (which may not be alternating and/or symmetrical) to the battery 105. Such positive and negative pulses may have different pulse parameters from each other (e.g., amplitude, frequency, ON/OFF time, shape, duty cycle, or the like) but may carry the same amount of charge/discharge. In other words, the application of a sequence of such set of pulses have a zero-charge effect on the battery (e.g., net charge change in the battery is zero).

In some implementations, the third set of pulses may comprise a train of positive pulses followed by a train of negative pulses, or the vice versa. The train of negative pulses may discharge the battery by a particular amount which is equal to the amount of charge put into the battery by the train of positive pulses. Thus, the third set of pulses carry a net zero charge.

In an example implementation, the controller 110 may determine that the voltage or SoC of the battery 105 (measured second battery parameter) has attained the particular value before deciding to apply the third set of pulses for the formation of SEI layer. In some implementations, the value may not be the exact value but a range of values. So, if the value of voltage (e.g., OCV) or SoC of the battery 105 is determined to be in a particular range of values, the controller 110 may decide to apply the third set of pulses to the battery 105.

In some implementations, the third set of pulses are applied to the battery until the first battery parameter (e.g., thickness of SEI layer) is measured again, and the cycle of applying the set of pulses (carrying the net zero charge) followed by the set of pulses (carrying the net positive charge to change voltage or SoC of the battery by a particular amount or range) which is followed by the another set of pulses (carrying the net zero charge) is repeated again.

In some implementations, the cycle of applying the first set of pulses (having the first frequency and net zero charge) followed by the second set of pulses (having the first frequency or the second frequency, and the net positive charge) followed by the third set of pulses (having the second frequency and the net zero charge) may be repeatedly performed until the battery is determined to be fully formed. In other words, in some implementations, one or more of the steps 205 to 225 are repeatedly formed until the battery is fully formed.

In some implementations, the next set of pulses to be applied subsequently to the application of the third set of pulses may have a different frequency (e.g., fourth frequency, fifth frequency or so on.) which may be selected (e.g., by the controller 110) based on the current value of the second battery parameter (e.g., current value of voltage or the SoC of the battery 105).

FIG. 3 is a flowchart illustrating an example method for battery formation in accordance with another non-limiting implementation of the present specification. The method 300 illustrated in FIG. 3 may be performed by the controller 110 for formation of the battery 105. The controller 110 may employ example hardware illustrated in FIGS. 5 and 6 to perform the method 300.

The method 300 illustrated in FIG. 3 is similar to method 200 illustrated in FIG. 2 except in method 300, the first set of pulses are applied to the battery for a particular amount of time. And after expiry of the particular amount of time, the second set of pulses are applied to the battery. This is in contrast to method 200 where the first set of pulses are applied to the battery until a determination is made that the value of the first battery parameter (e.g., SEI layer thickness) has attained a particular value or is in a particular range of values.

The method 300 begins at 305, where a first set of pulses are applied to the battery for a particular time period. The particular time period for which the first set of pulses are applied may be determined based on battery characterization. In some implementations, a value of the particular time period for which the first set of pulse are applied may be determined based on a battery type, battery chemistry, or the like. In an example, the value of the particular time period may be determined based on a rate of formation of SEI layer inside the battery, which is dependent on the battery type, battery condition, the battery chemistry, or the like.

The first set of pulses are applied at a particular frequency (e.g., first frequency) to the battery, and the first set of pulses carry a net zero charge. In some implementations, the first set of pulses may carry high current (e.g., up to 1 C) or very high current (e.g., up to 10 C). In an example implementation, a sequence of alternating positive and negative pulses may be applied to the battery 105 as the first set of pulses, in that an amount of charge applied by the positive pulses to the battery 105 is equal to the amount of charge removed from the battery 105 by the negative pulses. Therefore, the sequence of alternating positive and negative pulses carries a net zero charge. In other words, the sequence of alternating positive pulses and negative pulses applied to the battery 105 may comprise each positive pulse followed by a negative pulse and vice versa. Since the amount of charge and discharge provided by the positive and negative pulses is same, the net effect on a state of charge (SoC) of the battery 105 is zero.

In some implementations, the first set of pulses may comprise a sequence of symmetrical alternating positive and negative pulses. In an example implementation, the controller 110 may apply the sequence of symmetrical alternating positive and negative pulses to the battery 105. In some implementations, the symmetrical positive and negative pulses comprise pulses having same characteristics (e.g., same amplitude, frequency, ON/OFF time, shape, duty cycle, or the like) except for the polarity of a pulse. In other words, after each positive pulse (e.g., charge pulse), a symmetrical negative pulse (e.g., discharge pulse)—that has same pulse characteristic(s) as the preceding positive pulse is applied to the battery, and vice versa. Such sequence of symmetrical alternating positive and negative pulses may also carry a net zero charge. In other words, the application of such a sequence may result in no change in SoC of the battery. Such sequence of symmetrical alternating positive and negative pulses is illustrated in FIGS. 3A and 3C.

In some implementations, the first set of pulses may comprise positive and negative pulses, which may not be alternating and/or symmetrical. However, the net charge carried by such positive and negative pulses (e.g., total charge by positive pulses minus total discharge by negative pulses) may be zero. In an example implementation, the controller 110 may apply such sequence of positive and negative pulses (which may not be alternating and/or symmetrical) to the battery 105. Such positive and negative pulses may have different pulse parameters from each other (e.g., amplitude, frequency, ON/OFF time, shape, duty cycle, or the like) but may carry the same amount of charge/discharge. In other words, the application of a sequence of such set of pulses have a zero-charge effect on the battery (e.g., net charge change in the battery is zero).

In some implementations, the first set of pulses may comprise a train of positive pulses followed by a train of negative pulses, or the vice versa. The train of negative pulses may discharge the battery by a particular amount which is equal to the amount of charge put into the battery by the train of positive pulses. Thus, the first set of pulses carry a net zero charge.

At 310, after the expiry of the particular time period, a second set of pulses that carry the net positive charge are applied to the battery. In some implementations, the second set of pulses may comprise positive and negative pulses. The amount of charge applied to the battery by the positive pulses of the second set of pulses is greater than the amount of charge withdrawn from the battery by the negative pulses of the second set of pulses, therefore resulting in overall charge of the second positive pulses to be net positive charge. In some implementations, the second set of pulses may comprise only positive pulses (no negative pulses). In some implementations, the second set of pulses to be applied to the battery may be chosen to have a particular amount of net positive charge such that the second set of pulses results in particular amount of increase in voltage (e.g., 0.1 V, 0.25V, or 0.5 V increase) or SoC (2%, 5%, or 10% SoC increase) in the battery.

In some implementations, the second set of pulses may have the first frequency (similar to the first set of pulses) or the second frequency (similar to the third set of pulses). In other words, the second set of pulses may be applied to the battery 105 at the frequency which is same as a frequency of pulses preceding the second set of pulses, or at the frequency which is same as a frequency of a set of pulses that are to be applied subsequent to the application of the second set of pulses. In some implementations, the amplitude difference between the positive and negative pulses of the second set of pulses may be low (e.g., C/20) for varying SoC of the battery at a slower rate. In an example implementation, the controller 110 may modulate the amplitude difference between the positive and negative pulses of the second set of pulses to vary the rate at which the SoC of the battery 105 changes.

At 315, after the second set of pulses are applied to the battery, a battery parameter may be measured. In some implementations, the battery parameter may be one of a voltage or SoC of the battery. For example, the controller 110 after applying the second set of the pulses to the battery 105 may determine a value of one of voltage or SoC of the battery 105. As described previously, the controller 110 applies the second set of pulses having net the positive charge to the battery 105 for the voltage (e.g., open circuit voltage (OCV)) or SoC of the battery to reach the particular value where then the next set of pulses (e.g., third set of pulses) are to be applied for the SEI layer to be formed at that voltage or SoC level of the battery. Therefore, after applying the second set of pulses to the battery 105, the controller may determine a value of voltage or SoC of the battery to ensure that the voltage or SoC of the battery is at the particular value before deciding to apply the next set of pulses for the formation of the SEI layer at that particular voltage or SoC level of the battery.

At 320, the third set of pulses that carry a net zero charge are applied to the battery based on the measured battery parameter. The third set of pulses are applied at a particular frequency (e.g., second frequency) to the battery, which is different from the first frequency at which the first set of values are applied. The frequency of the third set of pulses may be determined based on the measured battery parameter. In other words, the frequency of the third set of pulses to be applied to the battery may be determined based on the current value of voltage (e.g., OCV) or SoC of the battery.

The third set of pulses carry a net zero charge. In some implementations, the third set of pulses may carry high current (e.g., up to 1 C) or very high current (e.g., up to 10 C). In an example implementation, a sequence of alternating positive and negative pulses (forming the third set of pulses) may be applied to the battery 105 as the third set of pulses, in that an amount of charge applied by the positive pulses to the battery 105 is equal to the amount of charge removed from the battery 105 by the negative pulses. Therefore, the sequence of alternating positive and negative pulses carries a net zero charge. In other words, the sequence of alternating positive pulses and negative pulses applied to the battery 105 may comprise each positive pulse followed by a negative pulse and vice versa. Since the amount of charge and discharge provided by the positive and negative pulses is same, the net effect on a state of charge (SoC) of the battery 105 is zero.

In some implementations, the third set of pulses may comprise a sequence of symmetrical alternating positive and negative pulses (similar to the first set of pulses but different in frequency of pulses). In an example implementation, the controller 110 may apply the sequence of symmetrical alternating positive and negative pulses to the battery 105. In some implementations, the symmetrical positive and negative pulses comprise pulses having same characteristics (e.g., same amplitude, frequency, ON/OFF time, shape, duty cycle, or the like) except for the polarity of a pulse. In other words, after each positive pulse (e.g., charge pulse), a symmetrical negative pulse (e.g., discharge pulse)—that has same pulse characteristic(s) as the preceding positive pulse is applied to the battery, and vice versa. Such sequence of symmetrical alternating positive and negative pulses may also carry a net zero charge. In other words, the application of such a sequence may result in no change in SoC of the battery. Such sequence of symmetrical alternating positive and negative pulses is illustrated in FIGS. 3A and 3C.

In some implementations, the third set of pulses may comprise positive and negative pulses, which may not be alternating and/or symmetrical. However, the net charge carried by such positive and negative pulses (e.g., total charge by positive pulses minus total discharge by negative pulses) may be zero. In an example implementation, the controller 110 may apply such sequence of positive and negative pulses (which may not be alternating and/or symmetrical) to the battery 105. Such positive and negative pulses may have different pulse parameters from each other (e.g., amplitude, frequency, ON/OFF time, shape, duty cycle, or the like) but may carry the same amount of charge/discharge. In other words, the application of a sequence of such set of pulses have a zero-charge effect on the battery (e.g., net charge change in the battery is zero).

In some implementations, the third set of pulses may comprise a train of positive pulses followed by a train of negative pulses, or the vice versa. The train of negative pulses may discharge the battery by a particular amount which is equal to the amount of charge put into the battery by the train of positive pulses. Thus, the third set of pulses carry a net zero charge.

In an example implementation, the controller 110 may determine that the voltage or SoC of the battery 105 (measured second battery parameter) has attained the particular value before deciding to apply the third set of pulses for the formation of SEI layer. In some implementations, the value may not be the exact value but a range of values. So, if the value of voltage (e.g., OCV) or SoC of the battery 105 is determined to be in a particular range of values, the controller 110 may decide to apply the third set of pulses to the battery.

In some implementations, the third set of pulses are applied to the battery for the particular time period (which may or may not be same as the time period for which the first set of pulses are applied to the battery), and the cycle of applying the set of pulses (carrying the net zero charge) followed by the set of pulses (carrying the net positive charge to change voltage or SoC of the battery by a particular amount or range) which is followed by the another set of pulses (carrying the net zero charge) is repeated again.

In some implementations, the cycle of applying the first set of pulses (having the first frequency and net zero charge) followed by the second set of pulses (having the first frequency or the second frequency, and the net positive charge) followed by the third set of pulses (having the second frequency and the net zero charge) may be repeatedly performed until the battery is determined to be fully formed.

In some implementations, the next set of pulses to be applied subsequently to the application of the third set of pulses may have a different frequency (e.g., fourth frequency, fifth frequency or so on.) which may be selected (e.g., by the controller 110) based on the current value of the second battery parameter (e.g., current value of voltage or the SoC of the battery 105).

In some implementations, the battery charge and discharge capacity measurements may be performed at some stage of the battery formation process, which indicate current capacity of the battery build during the battery formation process, and which may subsequently be used as to when to stop the battery formation process.

It is to contemplated that the present methods (e.g., method 200, 300) provide for the pulse parameters to be varied for the battery formation process, however in some implementations, at all times, positive and negative pulses applied to the battery have to be symmetrical (i.e. carry the same amount of charge) to each other, except during the time durations when battery voltage or SoC needs to be varied. The voltage variance would allow to move formation process for different states of charge of the battery, if needed.

During such voltage variation, the pulses applied to the battery may not be symmetrical to each other.

In an example, for the need of maintaining a certain voltage range (or sequential different voltage ranges) during the battery formation process-a film forming Sulfur-containing chemical additive such as ethylene sulfite (ES) is added. ES gets reduced sufficiently at battery cell voltage of 2.4V. Byproducts of the additive reduction comprising organic and inorganic compounds like LiS2O3 and ROSO2Li could effectively passivate the electrode surface. In this example such reduction process would continue for approximately 30 minutes while C/5 amplitude net zero charge symmetrical pulse sequence is maintained. At this stage it would be beneficial to switch the formation process from net zero charge mode to a slow charging mode while positive pulse amplitudes are going to be higher than negative pulses to maintain a C/10 net charge rate. Moving the battery cell voltage further, to 3.2V value, the reduction process of the second exemplary film forming additive such as vinyl carbonate (VC) would be initiated. Such an exemplary chain of reduction processes allows to consume ES additive and form a first protective film layer on the anode electrode prior to onset of VC additive reduction which creates a second protective film layer. Such process is beneficial for building of a strong multi layered film during the battery cell formation.

Figure 4A:
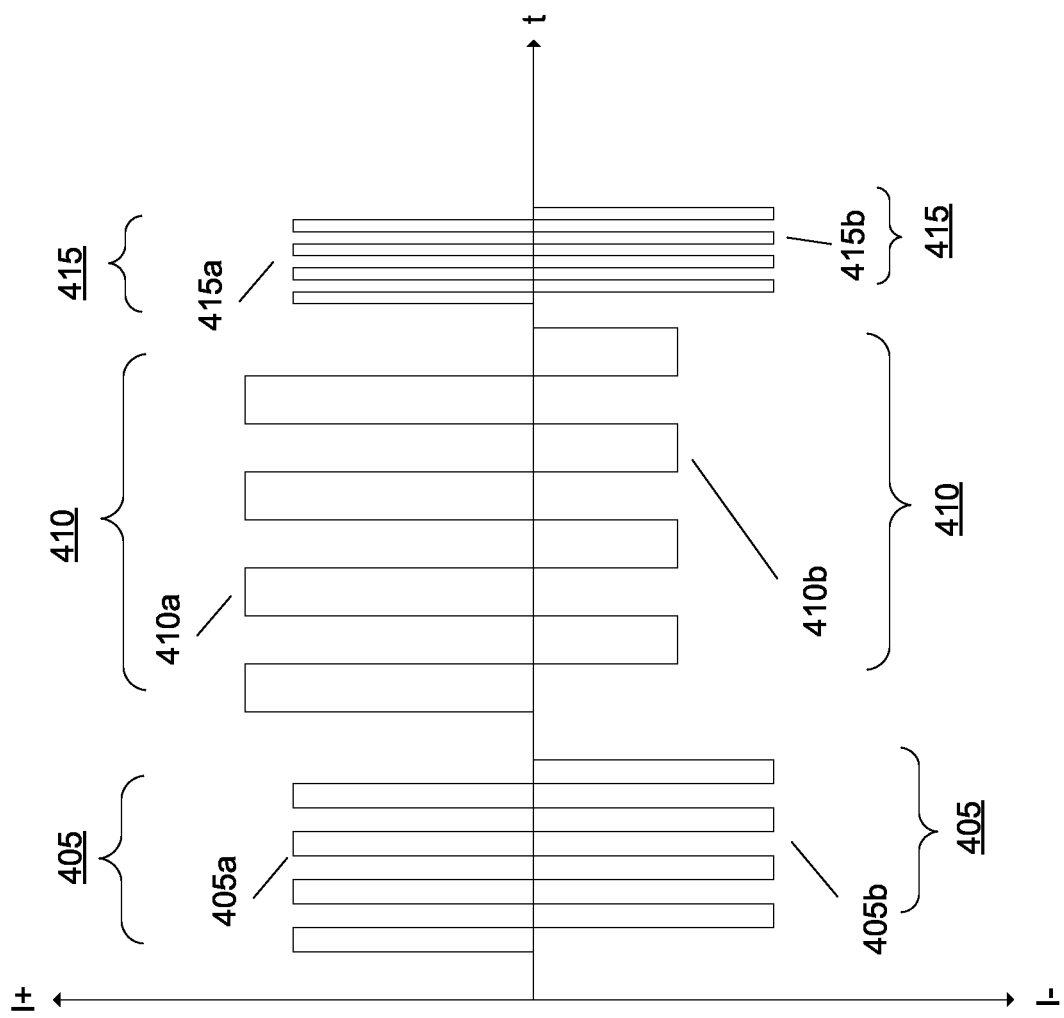
FIGS. 4A-4C illustrate examples of pulses used for battery formation, in accordance with some implementations of the present specification.
Figure 4B:
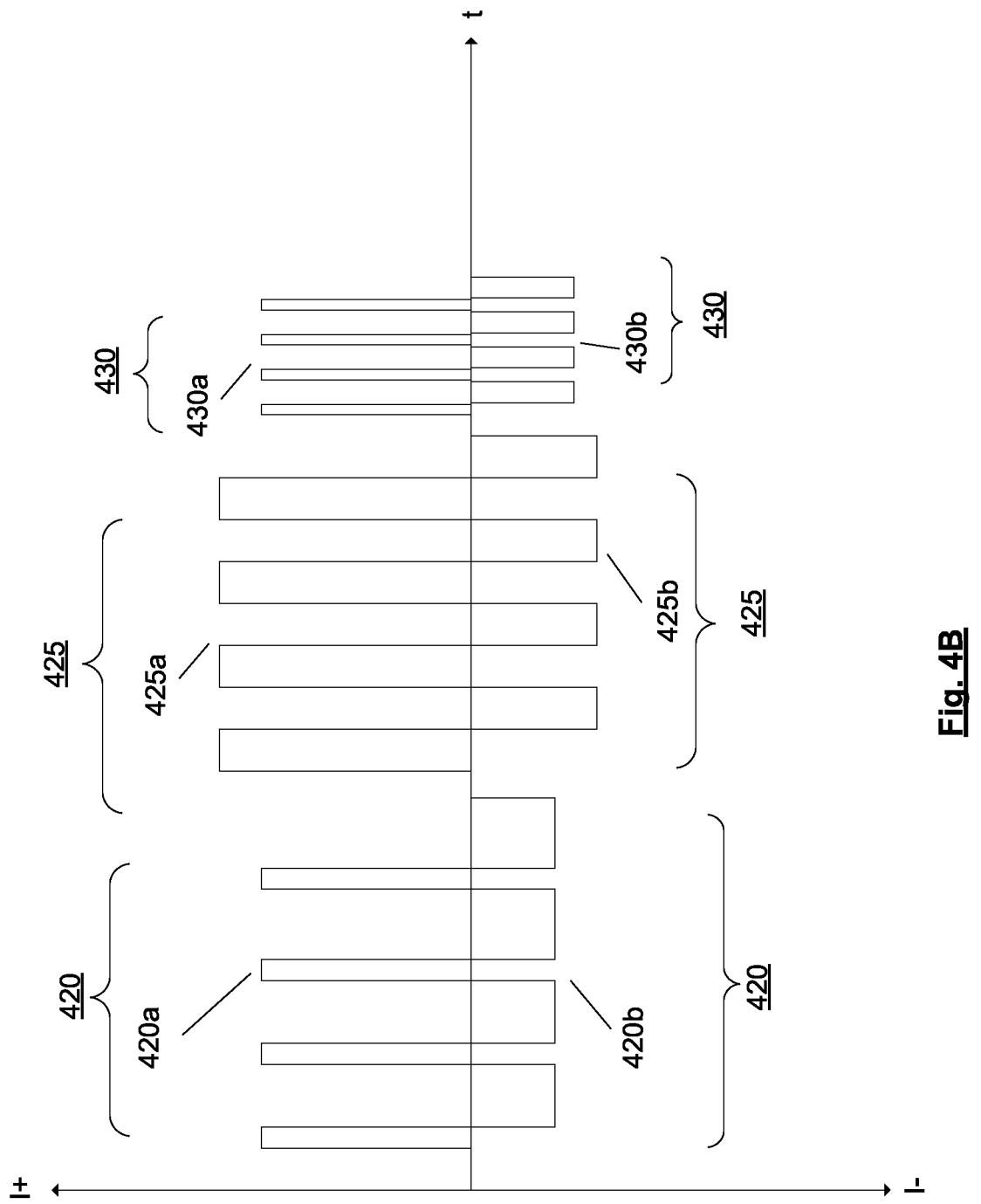
Figure 4C:
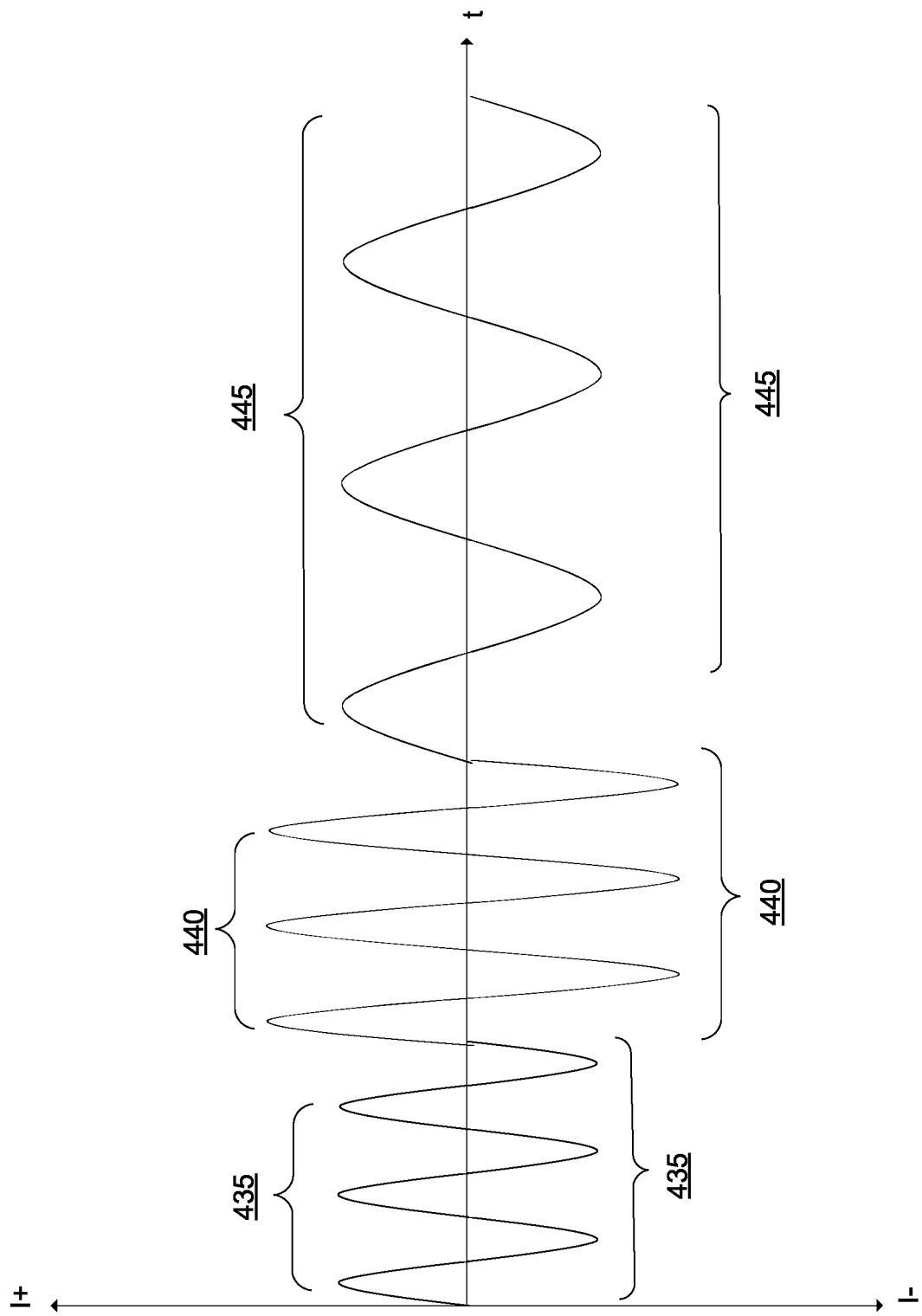

FIG. 4A-4C show examples of first set of pulses, second set of pulses, and third set of pulses as described in relation to methods 200, 300 above. Referring to FIG. 4A, the first set of pulses 405 comprises a sequence of alternating symmetrical positive and negative pulses 405a, 405b. In other words, each positive pulse 405a of the first set of pulses is followed by a symmetrical negative pulse 405b, and each negative pulse 405b is followed by and/or preceded by a symmetrical positive pulse 405a. As described previously, the positive and negative pulses 405a, 405b being symmetrical to each other means they carry same amount of charge/discharge, thus resulting in the first set of pulses 405 carrying a net zero charge.

Though FIG. 4A shows positive pulses 405a to be symmetrical to negative pulses 405b. It is contemplated that the positive pulses 405a in the first set of pulses 405 do not need to be symmetrical to each other, and may only be symmetrical to a following negative pulse. Similarly, the negative pulses 405b in the first set of pulses 405 do not need, to be symmetrical to each other, and may only be symmetrical to a preceding and/or following positive pulse 405a. Overall, the first set of pulses 405 should carry a net zero charge.

FIG. 4A further shows a second set of pulses 410 comprising a sequence of alternating positive and negative pulses 410a, 410b. As can be seen in FIG. 4A, the net charge carried by the positive pulses 410a is greater than the net charge/discharge carried by the negative pulses 410b, therefore resulting in the second set of pulses carrying a net positive charge.

Further, FIG. 4A shows the third set of pulses 415. Similar to the first set of pulses, the third set of pulses 415 comprises a sequence of alternating symmetrical positive and negative pulses 415a, 415b. In other words, each positive pulse 415a of the third set of pulses is followed by a symmetrical negative pulse 415b, and each negative pulse 415b is followed by and/or preceded by a symmetrical positive pulse 415a. As described previously, the positive and negative pulses 415a, 415b being symmetrical to each other means they carry same amount of charge/discharge, thus resulting in the third set of pulses 415 carrying a net zero charge. Similarly, as described for the first set of pulses 405, the positive pulses 415a in the third set of pulses 415 do not need to be symmetrical to each other, and each positive pulse 415a may only be symmetrical to a following negative pulse 415b, and vice versa. Overall, the third set of 415 pulses should carry a net zero charge.

It is further illustrated in FIG. 4A that the first set of pulses 405 and the third set of pulses 415 have a different frequency. In other words, the first set of pulses 405 is shown to be applied to the battery at a first frequency, and third set of pulses 415 is shown to be applied to the battery at a second frequency. Varying the frequency of pulses as described herein is based on a current state of charge (SoC) of the battery. As the SoC of the battery changes, therefore the frequency of pulses is varied as battery at different SoC levels responds better to different frequencies of pulses at least in terms of formation of the SEI layer. Therefore, when the second set of pulses carrying a net positive charge, applied to the battery (e.g., battery 105) results in change in the SoC of the battery, the frequency of the third set of pulses is chosen, to be different than the first set of pulses applied to the battery before the second set of pulses.

It is further contemplated that there may be scenarios (e.g., based on battery type, chemistry, or the like) where the frequency of battery formation pulses may not need to be varied with the progression of SoC. In such cases, the first frequency, the second frequency, and third frequency may be same to each other.

FIG. 4B illustrates another example of the different sets of pulses used for battery formation. In FIG. 4B, the first set of pulses 420 comprises alternating positive and negative pulses 420a, 420b, similarly the second set of pulses 425 comprises alternating positive and negative pulses 425a, 425b; and third set of pulses 430 comprises alternating positive and negative pulses 430a, 430b. In the first set of pulses 420, the positive and negative pulses 420a, 420b, are not symmetrical to each other (e.g., in terms of pulse parameters). For example, the positive pulses 420a have higher current but shorter duration, and the negative pulses 420b have lower current but longer duration, thereby carrying the same amount of charge/discharge resulting in the first set of pulses 420 carrying a net zero charge. Similarly, the positive pulses 430a have higher current but shorter duration, and the negative pulses 430b have lower current but longer duration, thereby carrying the same amount of charge/discharge resulting in the third set of pulses 430 carrying a net zero charge. The second set of pulses 425 carry a net positive charge. FIG. 4B further shows the first set of pulses 420 having a different frequency than the third set of pulses 430.

In FIGS. 4A and 4B, positive and negative pulses are shown to be continuous (e.g., pulse after pulse sequence), with no rest period between these pulses. However, it is contemplated that in some implementations, there may be a rest period after application of the positive pulse, and before application of the negative pulse (in the first set, second set, or third set of pulses). Similarly, in some implementations, another rest period may follow the application of the negative pulse and before application of the positive pulse (in the first set, second set, or third set of pulses). The system shown in FIG. 5 may be employed to apply such pulses, having rest periods between them, to the battery.

The positive and negative pulses used for battery formation as described herein may be of any shape, such as but not lime to, square, rectangular, trapezoidal, triangle (saw tooth shape), or the like. In some implementations, the shape of the positive and negative pulses may follow a mathematical function. In some implementations, the positive and the negative pulses used for the battery formation may be sinusoidal pulses. FIG. 4C shows such sinusoidal pulses. The first set of pulses 435, the second set of pulses 440, and the third set of pulses 445 are shown to be sinusoidal pulses. In some implementations, one or more of: the first set of pulses, the second set of pulses, and the third set of pulses may comprise sinusoidal pulses, whereas other of these set of pulses may comprise some other shaped pulses, such as, but not limited to square, rectangular, trapezoidal, or the like.

Figure 5:
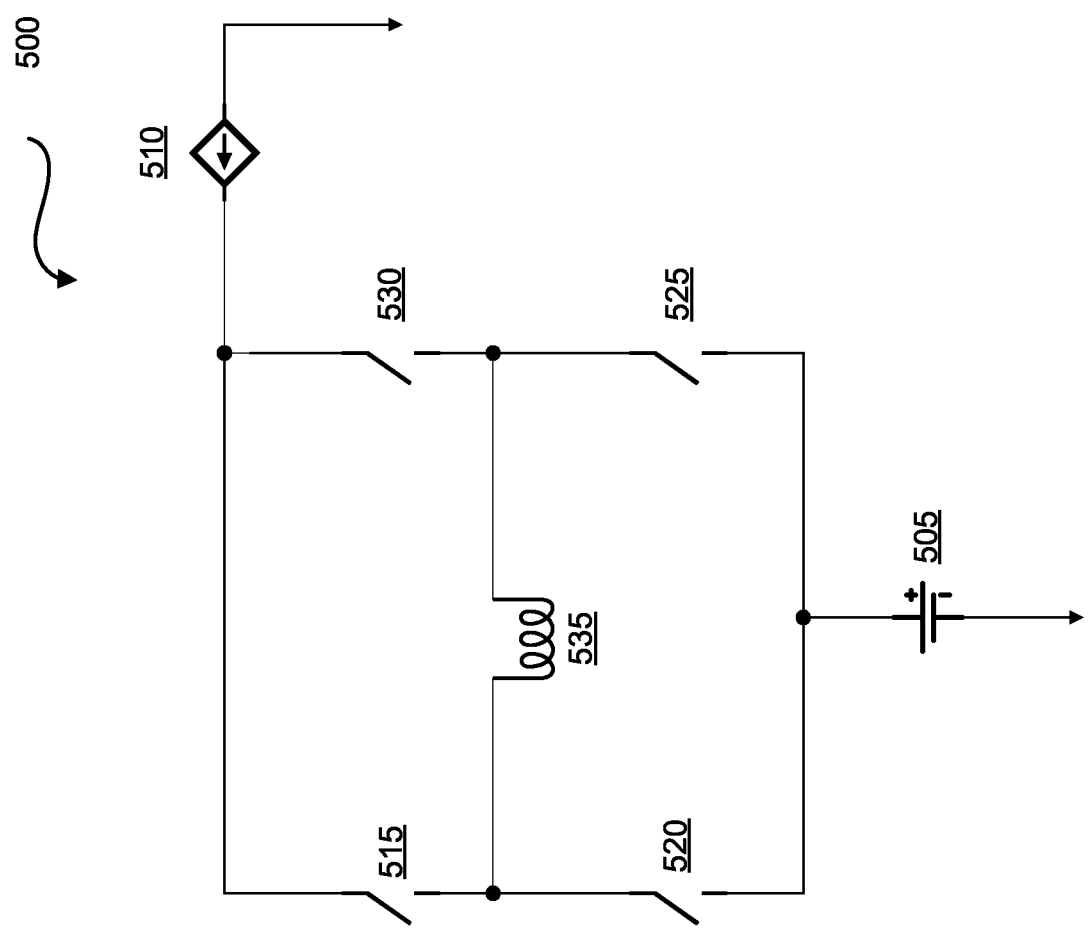
FIG. 5 illustrates an example system used for battery formation in accordance with some implementations of the present specification.

FIG. 5 illustrates an example system 500 that may be used for battery formation of a battery 505 in accordance with some implementations of the present disclosure. The system 500 may be operatively coupled to a controller (e.g., controller 110) which may control the system 500, and various elements or components of the system 500 to enable the system 500 to be used for battery formation in accordance with the methods disclosed herein. For example, the controller 110 may control opening and closing of various switches of the system 500 to apply positive and negative pulses to the battery in accordance with the various battery formation methods disclosed herein.

The system 500 comprises a power source 510, a plurality of switches (515, 520, 525, and 530), which may be FET switches, and an inductor 535 to apply positive and negative pulses to the battery 505 for battery formation in accordance with the methods (e.g., methods 200, 300) disclosed herein. One pair of the switches (one of 515, 525 pair and 520, 530 pair) may be used to apply positive pulses to the battery 505, and other one of 515, 525 pair and 520, 530 may be used to apply negative pulses to the battery 505. In an example operation, when the switches 515, 525 are closed (ON position), while the switches 520, 530 are open (OFF position), the current from the power source 510 will flow through the closed switches 515, 525, and will charge the inductor 535, and thereby supply current for positive pulses applied to the battery 505 for the battery formation. To provide negative pulses to the battery 505, the switches 520, 530 may be closed (ON position), and the switches 515, 525 may be opened (OFF position), thereby discharging the battery 505 through the inductor 535.

Another way of operation is to use switches 515, 525 for application of negative pulses to the battery 505, and to use the pair of switches 520, 530 for application of positive pulses to the battery 505. In that case, to apply positive pulses to the battery 505, the switches 520, 530 are closed, while switches 515, 525 remain opened, thereby providing current (positive pulses) to the battery 505 through the inductor 535. To apply negative pulses to the battery 505 (take current out of the battery), the switches 515, 525 are closed, while switches 520, 530 are opened.

Figure 6:
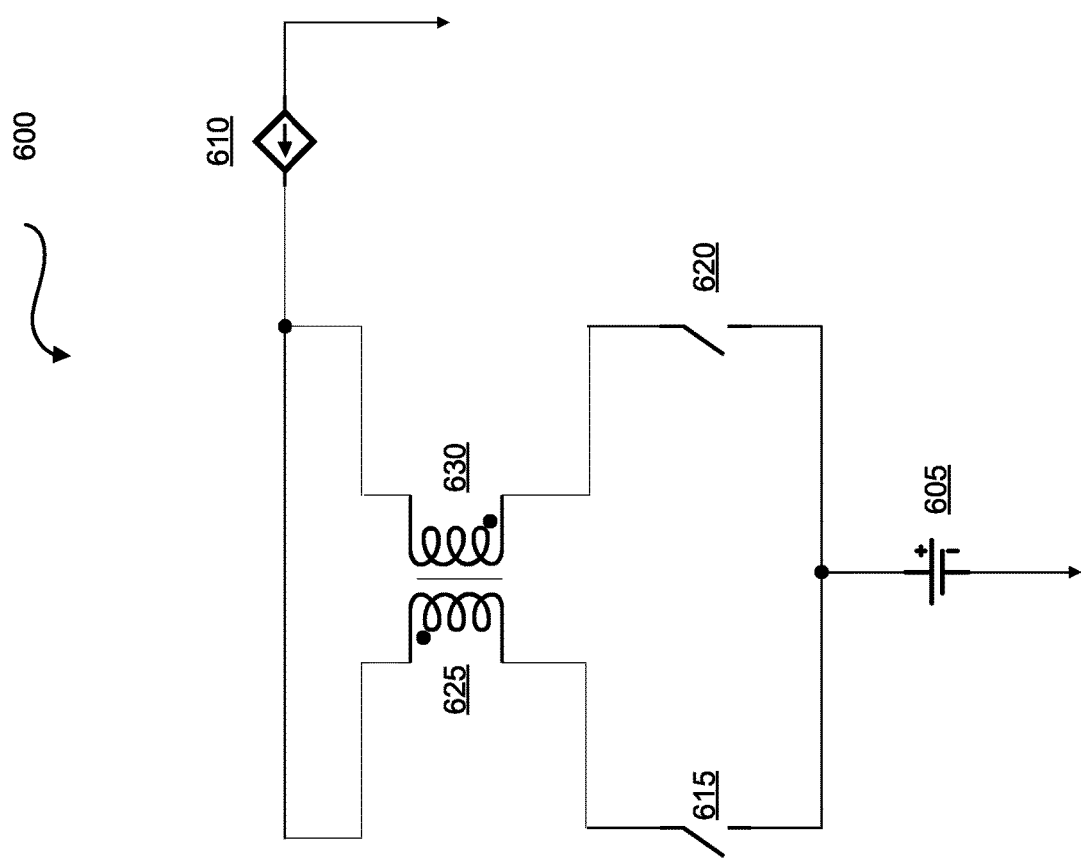
FIG. 6 illustrates another example system used for battery formation in accordance with some implementations of the present specification.

FIG. 6 illustrates another example system 600 that may be used for battery formation of a battery 605 in accordance with some implementations of the present disclosure. The system 600 may be operatively coupled to a controller (e.g., controller 110) which may control the system 600, and various elements or components of the system 600 to enable the system 600 to be used for battery formation in accordance with the methods disclosed herein. For example, the controller 110 may control opening and closing of various switches of the system 600 to apply positive and negative pulses to the battery in accordance with the battery formation methods disclosed herein.

The system 600 includes a power source 610, a pair of switches (615, 620), and a pair of inductor coils 625, 630 having opposite polarities to apply pulses to the battery 605 for battery formation. The system 600 appears to be simpler than the system 500 as it uses only two switches instead of four as used in system 500. However, the system 600 do not allow for the rest period between the pulses. In an operation, either of the switches 615, 620 may be used to provide positive pulses to the battery 605, and other of the switches 615, 620 may be used to provide negative pulses to the battery. For example, when switch 615 is selected as to be used to provide positive pulses to the battery 605, the switch 615 is closed (ON position), and the switch 620 remains open (OFF position) for the current (thereby positive pulses) to be applied to the battery 605 through inductor coil 625. Similarly, the switch 620 may be closed and the switch 615 may be opened to apply negative pulses to the battery 605, e.g., to take the current out of the battery 605 through the inductor coil 630.

In another way of implementation, the switch 620 may be selected as to be used to provide positive pulses to the battery 605, and the switch 615 may be selected to be used to provide negative pulses to the battery 605. For example, the switch 620 may be closed, and the switch 615 may remain open for the current (thereby positive pulses) from the power supply 610 to be applied to the battery 605 through the inductor coil 630. Similarly, the switch 615 may be closed, and the switch 620 may be opened to apply negative pulses to the battery 605, e.g., take the current out of the battery through the inductor 625.

A person of ordinary skill in the art will understand that by controlling the switches as illustrated above, pulses (symmetrical or asymmetrical) may be applied to the battery for the battery formation. The example hardware illustrated in the FIGS. 5 and 6 above is much more energy efficient (as compared to conventional battery formation approaches), since energy of negative (discharge) pulses is recuperated for the positive (charge) pulses by virtue of inductive element(s) acting as the energy reservoir in the circuits.

Conventionally, battery formation processes are controlled or performed for the fixed amount of time. However, the methods disclosed herein provide for information to be extracted from the battery measurements (e.g., by FFT transform), which may indicate current thickness of the SEI layer formed during the battery formation process, or current impedance of the battery, or other parameters, which may be used as a basis as to when to stop the battery formation process, thus reducing the time consumed in the battery formation.

Further, the measurements corresponding to the battery capacity or other battery parameters (e.g., impedance of the battery) during the battery formation process allow for the controlled battery formation process, which results in substantially matching batteries being formed. For example, while performing the battery formation process in accordance with the present disclosure, it is determined that the current capacity of battery 1 is 2.1 Amph (target capacity is 2 Amph), whereas the current capacity of the battery 2 is 2.05 Amph (target capacity is 2 Amph), so the formation process for battery 1 is continued for a longer time duration until the target capacity for the battery 1 is achieved by consuming excess lithium into build-up of the SEI layer, whereas battery formation process for battery 2 is continued for a shorter time duration until the target capacity for battery 2 is achieved.

It will be appreciated that the modules, processes, systems, and sections described above can be implemented in hardware, hardware programmed by software, software instructions stored on a non-transitory computer readable medium or a combination of the above. A system and/or a module as described above, for example, can include a processor configured to execute a sequence of programmed instructions stored on a non-transitory computer readable medium. For example, the processor can include, but not be limited to, a personal computer or workstation or other such computing system that includes a processor, microprocessor, microcontroller device, or is comprised of control logic including integrated circuits such as, for example, an Application Specific Integrated Circuit (ASIC). The instructions can be compiled from source code instructions provided in accordance with a programming language such as Java, C, C++, C#.net, assembly or the like. The instructions can also comprise code and data objects provided in accordance with, for example, the Visual Basic™ language, or another structured or object-oriented programming language. The sequence of programmed instructions, or programmable logic device configuration software, and data associated therewith can be stored in a non-transitory computer-readable medium such as a computer memory or storage device which may be any suitable memory apparatus, such as, but not limited to ROM, PROM, EEPROM, RAM, flash memory, disk drive, or the like.

Furthermore, the modules, processes systems, and sections can be implemented as a single processor or as a distributed processor. Further, it should be appreciated that the steps mentioned above may be performed on a single or distributed processor (single and/or multi-core, or cloud computing system). Also, the processes, system components, modules, and sub-modules described in the various figures of and for embodiments above may be distributed across multiple computers or systems or may be co-located in a single processor or system. Example structural embodiment alternatives suitable for implementing the modules, sections, systems, means, or processes described herein are provided below.

The modules, processors or systems described above can be implemented as a programmed general purpose computer, an electronic device programmed with microcode, a hardwired analog logic circuit, software stored on a computer-readable medium or signal, an optical computing device, a networked system of electronic and/or optical devices, a special purpose computing device, an integrated circuit device, a semiconductor chip, and/or a software module or object stored on a computer-readable medium or signal, for example.

Embodiments of the methods and systems (or their subcomponents or modules), may be implemented on a general-purpose computer, a special-purpose computer, a programmed microprocessor or microcontroller and peripheral integrated circuit element, an ASIC or other integrated circuit, a digital signal processor, a hardwired electronic or logic circuit such as a discrete element circuit, a programmed logic circuit such as a PLD, PLA, FPGA, PAL, or the like. In general, any processor capable of implementing the functions or steps described herein can be used to implement embodiments of the method, system, or a computer program product (software program stored on a non-transitory computer readable medium).

Furthermore, embodiments of the disclosed methods, systems, and computer program product (or software instructions stored on a non-transitory computer readable medium) may be readily implemented, fully or partially, in software using, for example, object or object-oriented software development environments that provide portable source code that can be used on a variety of computer platforms. Alternatively, embodiments of the disclosed method, system, and computer program product can be implemented partially or fully in hardware using, for example, standard logic circuits or a VLSI design. Other hardware or software can be used to implement embodiments depending on the speed and/or efficiency requirements of the systems, the particular function, and/or particular software or hardware system, microprocessor, or microcomputer being utilized. Embodiments of the method, system, and computer program product can be implemented in hardware and/or software using any known or later developed systems or structures, devices and/or software by those of ordinary skill in the applicable art from the function description provided herein and with a general basic knowledge of the software engineering and computer networking arts.

Moreover, embodiments of the disclosed methods, systems, and computer readable media (or computer program product) can be implemented in software executed on a programmed general purpose computer, a special purpose computer, a microprocessor, a network server or switch, or the like.

In the foregoing specification, specific embodiments have been described. However, one of ordinary skill in the art appreciates that various modifications and changes can be made without departing from the scope of the disclosure as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The disclosure is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A method of battery formation, the method comprising:
    applying a first set of pulses, having a first frequency, to a battery, wherein the first set of pulses carry a net zero charge;
    after applying the first set of pulses to the battery, measuring a first battery parameter;
    applying, based on the measured first battery parameter, a second set of pulses to the battery, wherein the second set of pulses carry a net positive charge;
    after applying the second set of pulses to the battery, measuring a second battery parameter; and
    applying, based on the measured second battery parameter, a third set of pulses, having a second frequency, to the battery, wherein the third set of pulses carry a net zero charge.

2. The method of claim 1, wherein applying the first set of pulses to the battery comprises applying a sequence of alternating positive pulses and negative pulses to the battery.

3. The method of claim 1, wherein applying the third set of pulses to the battery comprises applying a sequence of alternating positive pulses and negative pulses to the battery.

4. The method of claim 1, wherein measuring the first battery parameter comprises determining a thickness of solid electrolyte interphase (SEI) layer of the battery.

5. Method of claim 1, wherein measuring the second battery parameter comprises determining a value of one of: a state of charge (SoC) or a voltage of the battery.

6. The method of claim 1 further comprising:
    determining a value of the second frequency based on the measured second battery parameter.

7. The method of claim 1, wherein applying the first set of pulses to the battery comprises applying sinusoidal pulses to the battery.

8. The method of claim 1, wherein applying the third set of pulses to the battery comprises applying sinusoidal pulses to the battery.

9. The method of claim 1, wherein applying the second set of pulses to the battery comprises applying a set of pulses, having the first frequency or the second frequency, to the battery.

10. A method of battery formation, the method comprising:
    applying, for a particular time period, a first set of pulses, having a first frequency, to a battery, wherein the first set of pulses carry a net zero charge;
    after expiry of the particular time period, applying a second set of pulses to the battery, wherein the second set of pulses carry a net positive charge;
    after applying the second set of pulses to the battery, measuring a battery parameter; and applying, based on the measured battery parameter, a third set of pulses, having a second frequency, to the battery, wherein the third set of pulses carry a net zero charge.

11. The method of claim 10, wherein applying the first set of pulses to the battery comprises applying a sequence of alternating positive pulses and negative pulses to the battery.

12. The method of claim 10, wherein applying the third set of pulses to the battery comprises applying a sequence of alternating positive pulses and negative pulses to the battery.

13. The method of claim 10, wherein measuring the battery parameter comprises determining a value of one of: a state of charge (SoC) or a voltage of the battery.

14. The method of claim 10, wherein applying the first set of pulses to the battery comprises applying sinusoidal pulses to the battery.

15. The method of claim 10, wherein applying the third set of pulses to the battery comprises applying sinusoidal pulses to the battery.

* * * * *